US006821826B1

United States Patent
Chan et al.

(10) Patent No.: US 6,821,826 B1
(45) Date of Patent: Nov. 23, 2004

(54) THREE DIMENSIONAL CMOS INTEGRATED CIRCUITS HAVING DEVICE LAYERS BUILT ON DIFFERENT CRYSTAL ORIENTED WAFERS

(75) Inventors: Victor Chan, Poughkeepsie, NY (US); Kathryn W. Guarini, Yorktown Heights, NY (US); Meikei Ieong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/674,644

(22) Filed: Sep. 30, 2003

(51) Int. Cl.[7] ............................................... H01L 29/04
(52) U.S. Cl. ...................... 438/150; 438/198; 438/285; 438/455; 438/459; 438/479; 257/74
(58) Field of Search ................................ 438/150, 149, 438/151, 152, 197, 198, 199, 285, 455, 459, 479; 257/74

(56) References Cited

U.S. PATENT DOCUMENTS

| | | | | |
|---|---|---|---|---|
| 4,612,083 A | * | 9/1986 | Yasumoto et al. | 438/59 |
| 5,236,118 A | * | 8/1993 | Bower et al. | 228/193 |
| 5,698,869 A | * | 12/1997 | Yoshimi et al. | 257/192 |
| 5,741,733 A | * | 4/1998 | Bertagnolli et al. | 438/152 |
| 6,287,940 B1 | * | 9/2001 | Cole et al. | 438/455 |
| 6,355,501 B1 | * | 3/2002 | Fung et al. | 438/107 |

* cited by examiner

Primary Examiner—Nathan J. Flynn
Assistant Examiner—Remmon R. Fordé
(74) Attorney, Agent, or Firm—Scully, Scott, Murphy & Presser; Wan Yee Cheung, Esq.

(57) ABSTRACT

Three-dimensional (3D) integration schemes of fabricating a 3D integrated circuit in which the pFETs are located on an optimal crystallographic surface for that device and the nFETs are located on a optimal crystallographic surface for that type of device are provided. In accordance with a first 3D integration scheme of the present invention, first semiconductor devices are pre-built on a semiconductor surface of a first silicon-on-insulator (SOI) substrate and second semiconductor devices are pre-built on a semiconductor surface of a second SOI substrate. After pre-building those two structures, the structure are bonded together and interconnect through wafer-via through vias. In a second 3D integration scheme, a blanket silicon-on-insulator (SOI) substrate having a first SOI layer of a first crystallographic orientation is bonded to a surface of a pre-fabricating wafer having second semiconductor devices on a second SOI layer that has a different crystallographic orientation than the first SOI layer; and forming first semiconductor device on the first SOI layer.

19 Claims, 2 Drawing Sheets

THREE DIMENSIONAL CMOS INTEGRATED CIRCUITS HAVING DEVICE LAYERS BUILT ON DIFFERENT CRYSTAL ORIENTED WAFERS

FIELD OF THE INVENTION

The present invention relates to complementary metal oxide semiconductor (CMOS) integrated circuits, and more particularly to three-dimensional CMOS integrated circuits having semiconductor device layers that are built on different crystal oriented wafers.

BACKGROUND OF THE INVENTION

In present semiconductor technology, CMOS devices, such as nFETs or pFETs, are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have high mobility for a (110) surface orientation. That is, hole mobility values on (100) Si are roughly 2x–4x lower than the corresponding electron hole mobility for this crystallographic orientation. To compensate for this discrepancy, pFETs are typically designed with larger widths in order to balance pull-up currents against the nFET pull-down currents and achieve uniform circuit switching pFETs having larger widths are undesirable since they take up a significant amount of chip area.

On the other hand, hole mobilities on (110) Si are 2x higher than on (100) Si; therefore, pFETs formed on a (110) surface will exhibit significantly higher drive currents than pFETs formed on a (100) surface. Unfortunately, electron mobilities on (110) Si surfaces are significantly degraded compared to (100) Si surfaces.

As can be deduced from the above discussion, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

It is becoming more difficult to achieve substantial integrated circuit (IC) performance enhancement by traditional CMOS device and interconnect scaling. New materials introduced into the front-end and back-end of IC fabrication are enabling the continuation of the performance trends, but such innovations may provide only a one-time or a short-lived boost, and fundamental physical limits may soon be reached.

There are several prior art techniques that are currently employed in fabricating 3D integrated circuits. In one prior art technique, the lowest device layer is fabricated on a bulk substrate or a silicon-on-insulator (SOI) substrate and then a second device layer is formed. The second device layer can be formed by epitaxial Si growth. Such a method is described, for example, in S. Pae, et al., "Multiple layers of silicon-on-insulator island fabrication by selective epitaxial growth," IEEE Elec. Dev. Lett 20:196–196 (1999). Another prior art technique to form the second device layer is by recrystallization of an amorphous Si layer. This approach is described, for example, in V. Subramanian, et al. "High performance Germanium seeded laterally crystallized TFTs for vertical device integration", IEEE Trans. Electron Devices 45, 1934–1939 (1998); T. Kunio, et al. "Three dimensional IC's having four stacked active device layers", IEDM Tech Dig 837–840 (1989); and V. W. C. Chan, et al. "Three-dimensional CMOS SOI integrated circuit using high-temperature metal-induced lateral crystallization", IEEE Trans Elec Dev 48:1394–1399 (2001).

Subsequent processes can then be performed in such prior art techniques to fabricate additional active devices and interconnecting wiring. Circuits fabricated in this manner suffer from two main drawbacks: (1) the recrystallized top layer often has poor electrical properties and it may result in lower device and circuit performance; it is also difficult to control the surface orientation of the recrystallized layer; (2) the thermal cycling from the top layer formation and sequential device fabrication degrades underlying device performance.

In some prior art techniques, 3D integrated circuits are achieved by wafer bonding. The 3D integration scheme using wafer bonding is disclosed, for example, in R. J. Gutmann, et al. "Three dimensional (3D) ICs: A technology platform for integrated systems and opportunities for new polmeric adhesives" Proc IEEE Int'l Conf on Polymers and Adhesives in Microelectronics and Photonics, Germany, 173–180 (2001); R. Reif, et al. "Fabrication technologies for three dimensional integrated circuits" Proc IEEE Int'l Symposium on Quality Electronic Design 33–37 (2002); and A. W. Topol, et al. A demonstration of wafer level layer transfer of high performance devices and circuits for three-dimensional integrated circuit fabrication" Proc. AVS ICMI, 5–7 (2003).

Despite these current advances using 3D integration, there is no prior art that fabricates 3D integrated circuits having nFETs and pFETs which are built on different surface orientations. Hence, there is a need for providing a new and improved 3D integration scheme that allows for each type of device present on a semiconductor chip or wafer to be formed upon a crystallographic surface orientation that provides optimal performance for each specific device. For example, there is a need for providing a 3D integration scheme wherein all nFETs are built on a (100) crystallographic surface and all pFETs are built on a (110) crystallographic surface.

SUMMARY OF THE INVENTION

The present invention provides a three-dimensional (3D) integration scheme of fabricating a 3D integrated circuit in which the pFETs are located on a (110) crystallographic surface and the nFETs are located on a (100) crystallographic surface. The term "3D integrated circuit" can be defined as an IC that contains multiple layers of active devices with vertical interconnections between the layers. In a 3D IC, each transistor can access a greater number of nearest neighbors than in a conventional two-dimensional (2D) circuit, such that each transistor or functional block will have a higher bandwidth.

One advantage of 3D integration is increased packing density; by adding a third dimension to the conventional 2D layout, the transistor packing density can be improved thereby allowing a reduced chip footprint. This is particularly appealing for wireless or portable electronics. Another advantage of 3D integration is that the total interconnect lengths are shorten. This provides shorter interconnect delays, less noise and improved electro-migration reliability. A further benefit of 3D integration is that the overall chip performance at a given power consumption can be substantially improved over a conventional 2D IC.

In accordance with a first 3D integration scheme of the present invention, first semiconductor devices are pre-built on a semiconductor surface of a first silicon-on-insulator (SOI) substrate that is optimal for the first semiconductor devices and second semiconductor devices, which are different from the first semiconductor devices, are pre-built on a semiconductor surface of a second SOI substrate that is optimal for the second semiconductor devices. After prebuilding those two structures, the structures are bonded together and interconnected through wafer-via through vias.

In broad terms, the first 3D integration scheme of the present invention comprises the steps of:

providing a first interconnect structure comprising at least a first semiconductor device located on a surface of a first Si-containing layer of a first silicon-on-insulator substrate, said first Si-containing layer having a first surface orientation that is optimal for said first semiconductor device;

attaching a handling wafer to a surface of the first interconnect structure;

providing a second interconnect structure comprising at least a second semiconductor device that differs from the first semiconductor device on a surface of a second Si-containing layer of a second silicon-on-insulator substrate, said second Si-containing layer having a second surface orientation that is optimal for said second semiconductor device;

bonding the first and second interconnect structures to each other; and removing the handling wafer.

In some embodiments of the present 3D integration scheme, vertical interconnects are provided between the first and second semiconductor devices.

In addition to the first 3D integration scheme mentioned above, the present invention also provides a second 3D integration scheme. The second 3D integration scheme of the present invention comprises:

bonding a blanket silicon-on-insulator (SOI) substrate having a first SOI layer of a first crystallographic orientation to a surface of a pre-fabricating wafer having at least one second semiconductor device on a second SOI layer that has a different crystallographic orientation than the first SOI layer; and forming at least one first semiconductor device in said first SOI layer.

In accordance with the present invention, the first semiconductor device may be a pFET and the first crystallographic orientation may be (110), while the second semiconductor device may be an nFET and the second crystallographic orientation may be (100). It is also possible in the present invention, that the first semiconductor device is an nFET and the first crystallographic orientation may be (100) and that the second semiconductor device is a pFET and the second crystallographic orientation maybe (110).

The present invention also provides a three dimensional (3D) integrated circuit that includes:

a first interconnect structure comprising at least a first semiconductor device located on a surface of a first Si-containing layer of a first silicon-on-insulator substrate, said first Si-containing layer having a first surface orientation that is optimal for said first semiconductor device;

a second interconnect structure comprising at least a second semiconductor device that differs from the first semiconductor device located on a surface of a second Si-containing layer of a second silicon-on-insulator substrate, said second Si-containing layer having a second surface orientation that is optimal for said second semiconductor device; and vertical interconnects connecting the first interconnect structure to the second interconnect structure.

DETAILED DESCRIPTION OF THE INVENTION

Figure 1A:
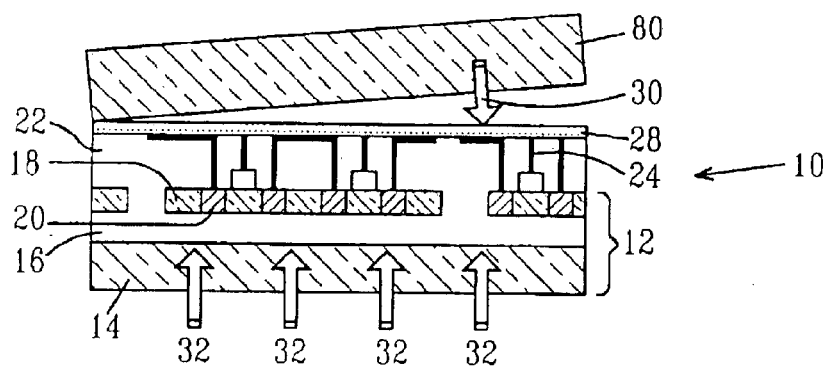
FIGS. 1A–1C are pictorial representations (through cross sectional views) illustrating a 3D integration scheme of the present invention.

The present invention, which provides 3D integration schemes for forming a 3D CMOS integrated circuit having device layers built on different crystal oriented SOI wafers, will now be described in greater detail by referring to the drawings that accompany the present invention. In the accompanying drawings, like and/or corresponding elements are referred to by like reference numerals.

In the present invention, the terms "silicon-on-insulator" or "SOI" wafer (the term 'substrate' can interchangeable used with the term 'wafer') are used to define a semiconductor structure in which a buried insulating layer, such as a buried oxide layer, separates a top Si-containing layer (also referred to as the SOI layer or the device layer) from a bottom Si-containing substrate layer. The term "Si-containing" is used in the present invention to denote a semiconductor material that includes silicon. Illustrative examples of such Si-containing materials include, but are not limited to: Si, SiGe, SiC, SiGeC, Si/Si, Si/SiGe, Si/SiC and Si/SiGeC. The buried insulating layer may be continuous or it may be non-continuous, i.e., a patterned buried insulating region. The non-continuous buried insulating regions are discrete and isolated regions or islands that are surrounded on all sides by a Si-containing material.

The SOI substrates that are employed in the present invention are made using techniques well known to those skilled in the art. For example, the SOI substrates can be made by wafer bonding and cutting. Alternatively, the SOI substrates can be made by a process known as SIMOX (separation by ion implantation of oxygen). In a typical SIMOX process, oxygen ions are implanted into a surface of a Si-containing substrate and then the substrate containing the implanted oxygen ions is annealed such that a buried oxide layer forms. In yet a further method, the SOI substrate can be made by forming an insulating film atop a Si-containing substrate by deposition or thermal means, optionally patterning the insulating layer, and then forming a top Si-containing layer overlying the insulating film.

Notwithstanding which technique is employed, the buried insulating layer of each SOI substrate employed in the present invention typically has a thickness from about 10 to about 1000 nm, with a thickness of about 100 to about 200 nm being more typical. The thickness of the top Si-containing layer of each SOI substrate employed in the present invention is typically from about 20 to about 200 nm, with a thickness from about 50 to about 100 nm being more typical. The thickness of the bottom Si-containing substrate layer of each SOI substrate employed in the present invention is inconsequential to the present invention.

The SOI layers of each SOI substrate may have various crystallographic surface orientations. For example, the SOI substrates may have a SOI layer that comprises a (100) crystal orientation, or a (110) crystal orientation. In accordance with the present invention, each SOI substrate employed contains an SOI layer that has a different crystal orientation. Thus, the present invention contemplates the use of a first SOI substrate having a first SOI layer of a first crystallographic orientation and a second SOI substrate having a second SOI layer of a second crystallographic orientation, wherein the first crystallographic orientation is different from the second crystallographic orientation.

In accordance with the present invention, each SOI layer will contain at least one semiconductor device such as an nFET or pFET, with the proviso that the at least one semiconductor device is located on a crystallographic surface that provides optimal device performance. Thus, for example, if the at least one semiconductor device, is a pFET, the pFET would be located atop a (110) crystal oriented SOI layer. When the at least one semiconductor device is an nFET, the nFET is located atop a (100) crystal oriented SOI layer.

The at least one semiconductor device is fabricated using conventional CMOS processing steps well known to those skilled in the art. For example, the FETs are formed by providing a gate dielectric layer on a surface of an SOI layer, forming a patterned gate conductor atop the gate dielectric, said patterned gate conductor including an optional patterned hardmask located thereon, implanting dopants into the SOI layer and optionally the gate conductor and forming sidewall spacers on vertical sidewalls of the patterned gate conductor. Trench isolation regions may be formed in each SOI substrate which extend partially, or entirely through the SOI layer stopping on a surface of the buried insulating layer.

After completion of the FETs, at least one interconnect level including an interconnect dielectric having conductive lines and vias is formed on the SOI structure utilizing a conventional back-end-of-the-line (BEOL) processing scheme. The BEOL processing includes deposition of the dielectric, patterning the deposited dielectric by lithography and etching and filling the patterned regions with a metal conductor. A single damascene or dual damascene technique, both of which are well known to those skilled in the art, may be used.

The above discussion provides some basics of the present invention including terminology, materials and processes for making initial interconnect structures that can be employed in the present invention. The following description with reference to specific drawings provides details of the 3D integrations schemes that may be employed in the present invention.

Figure 1B:
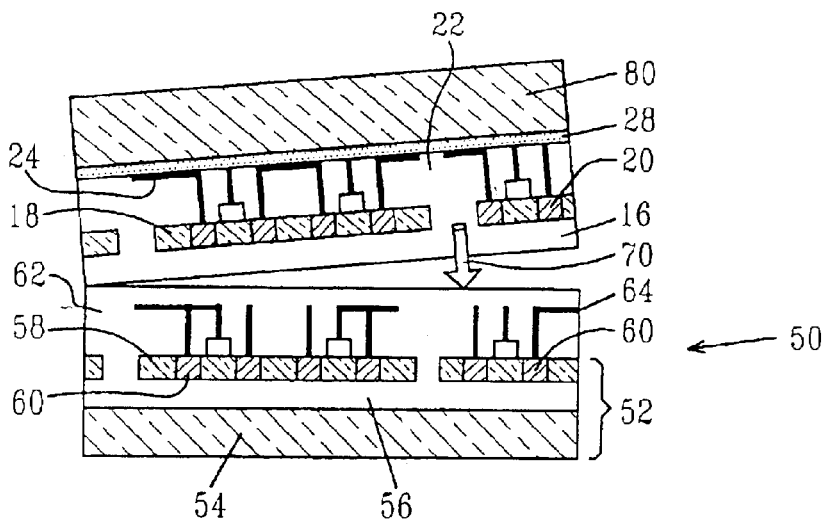
Figure 1C:
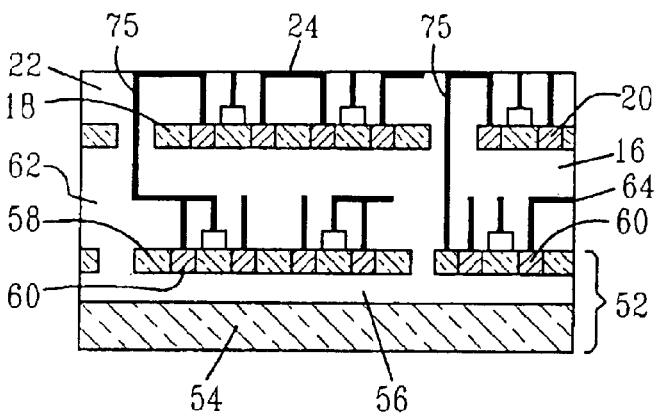

Reference is first made to FIGS. 1A–1C which illustrate a first 3D integration scheme of the present invention. In accordance with the first 3D integration scheme of the present invention, first semiconductor devices are pre-built on a semiconductor surface of a first silicon-on-insulator (SOI) substrate that is optimal for the first semiconductor devices and second semiconductor devices, which are different from the first semiconductor devices, are pre-built on a semiconductor surface of a second SOI substrate that is optimal for the second semiconductor devices. After pre-building those two structures, the structures are bonded together and interconnected through wafer-via through vias.

FIG. 1A shows an initial step of the first 3D integration scheme of the present invention in which a handling wafer 80 is attached to a first interconnect structure 10. The first interconnect structure 10 includes at least a first semiconductor device 20 located on a surface of a first Si-containing layer 18 of a first silicon on-insulator (SOI) substrate 12. In accordance with the present invention, the first Si-containing layer 18 has a first surface orientation that is optimal for the first semiconductor device 20.

In one embodiment, the first semiconductor device 20 is an nFET and the first Si-containing layer 18 has a (100) crystal orientation. In another embodiment, the first semiconductor device 20 is a pFET and the first Si-containing layer 18 has a (110) crystal orientation. The first semiconductor device 20 is fabricated as described above.

The first interconnect structure 10 also includes at least one dielectric 22 that has conductive wiring, i.e., lines and vias, located therein. The conductive wiring is designed by reference numeral 24 in FIG. 1A.

The handling wafer 80 comprises a bulk semiconductor substrate, another SOI substrate or glass which is attached to a surface of the first interconnect structure 10 via a polymeric adhesive. In FIG. 1A, the initial structure includes polymeric adhesive layer 28 between the first interconnect structure 10 and the handling wafer 80.

Illustrative types of polymeric adhesives that can be employed in the present invention may be conductive or nonconductive materials. A preferred polymeric adhesive employed in the present invention is a non-conductive material. The polymeric adhesive is typically applied to the uppermost surface of the first interconnect structure 10 and attachment is achieved by bringing the handling wafer 80 into intimate contact with the first interconnect structure 10. The attachment may be facilitated by applying an external force to the two structures or by heating the structures to a temperature that is slightly above the melting point of the polymeric adhesive. In FIG. 1A, the arrow labeled as 30 indicates the direction in which contact occurs.

After attachment, the bottom Si-containing substrate designated by reference numeral 14 of the first SOI substrate 12 is removed by a planarization process such as, for example, chemical mechanical polishing (CMP), grinding and/or etching. The planarization process stops once a surface of the buried insulating layer, designated by reference numeral 16 is reached. The arrows labeled as 32 show this thinning step of the present invention.

A second interconnect structure 50 comprising at least a second semiconductor device 60 located on a surface of a second Si-containing layer 58 of a second silicon on-insulator substrate 52 is provided and brought into contact with the structure shown in FIG. 1A. FIG. 1B illustrates this step of the present invention. In accordance with the present invention, the second Si-containing layer 58 has a second surface orientation that is optimal for the second semiconductor device. The second pre-fabricated SOI substrate 52 also includes a bottom Si-containing layer 54 and a buried insulating layer 56. The second interconnect structure also includes interconnect dielectric 62 and wiring regions 64.

In one embodiment, and when the first semiconductor device 20 is an nFET, the second semiconductor device 60 is a pFET that is located on the second Si-containing layer 58 which has a (110) crystal orientation. In another embodiment, and when the first semiconductor device 20 is a pFET, the second semiconductor device 60 is an nFET that is located on the second Si-containing layer 58 that has a (100) crystal orientation. It should be noted that the first semiconductor device 20 is different from the second semiconductor device 60 and that the crystallographic orientation of the first Si-containing layer 18 is different from the crystallographic orientation of the second Si-containing layer 58.

The first and second interconnect structure (10 and 50, respectively) are then bonded to each other. Specifically, bonding of the two interconnect structure is achieved by first bringing the two structures into intimate contact with other, optionally applying an external force to the contacted wafers; and then heating the two contacted structures under conditions that are capable of bonding the two structures together. The heating step may be performed in the presence or absence of an external force. The arrow designated by reference numeral 70 denotes the direction of the contacting.

The heating step is typically performed in an inert ambient at a temperature of from about 200° to about 1050° C. for a time period of from about 2 to about 20 hours. More preferably, the bonding is performed at a temperature of from about 200° to about 400° C. for a time period of from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$.

FIG. 1C shows the structure after the handling wafer 80 and the adhesive layer 28 are removed from the bonded structures. The handling wafer 80 and the adhesive layer 28 may be removed utilizing one of the planarization process mentioned above. That is, grinding, chemical mechanical polishing and/or etching may be used to remove the handling wafer and the adhesive layer from the bonded structures. Alternatively, the handling wafer 80 is removed by laser ablation, and the adhesive layer 28 is removed by a chemical etching process. FIG. 1C also shows the presence of optional vertical interconnects 75 that are formed by lithography, etching and deposition of a conductive metal. Despite being optional, the vertical interconnects 75 are preferred in some embodiments of the present invention wherein a direct connection between the two semiconductor devices is required.

The 3D integrated circuit shown in FIG. 1C includes semiconductor devices 20 and 60 such as nFETs and pFETs that are built upon a SOI layer (18 or 58) of a specific crystallographic orientation that is optimized for each device. In a preferred embodiment, the 3D integrated circuit includes nFETs on a (100) SOI layer and pFETs on a (110) SOI layer.

In addition to the first 3D integration scheme described above, the present invention also contemplates a second 3D integration scheme. The second 3D integration scheme will now be described in greater detail by referring to FIGS. 2A–2C. In the second integration scheme, a blanket SOI wafer 90 is stacked on a pre-fabricated device wafer 120 each wafer having an SOI layer with a different crystallographic orientation. The two wafers are then bonded and the blanket SOI wafer is subjected to further fabrication processes to make active devices and interconnects.

Figure 2A:
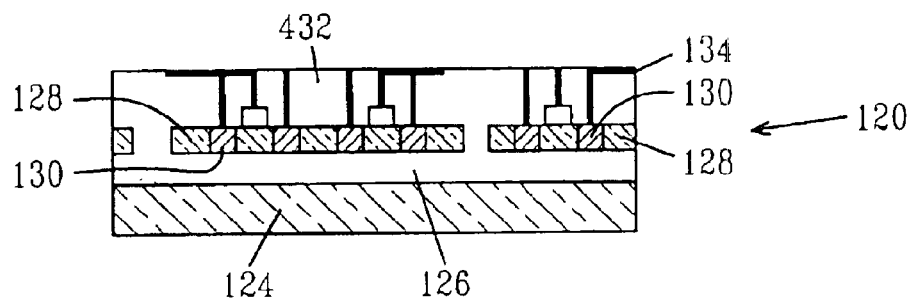
FIGS. 2A–2C are pictorial representations (through cross sectional views) illustrating an alternative 3D integration scheme of the present invention.
Figure 2B:
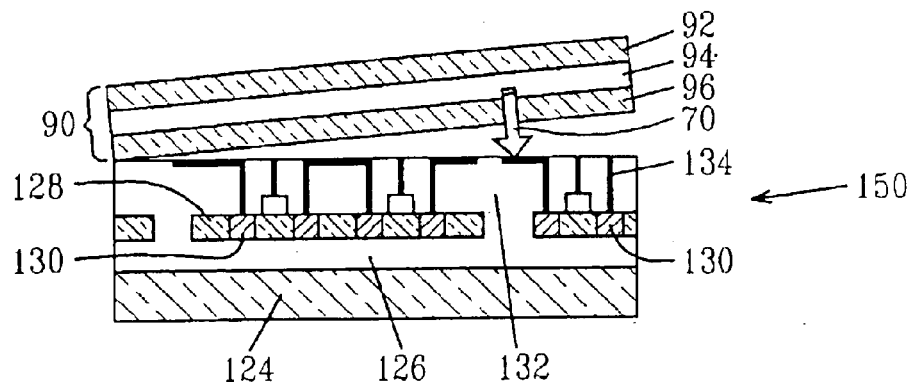

FIG. 2A illustrates an initial structure including a pre-fabricating wafer 120 having second semiconductor devices 130 on a second SOI layer 128. Layer 124 represents a bottom Si-containing layer and layer 126 represents a buried insulating layer. The pre-fabricating wafer 120 may also include an interconnect region including dielectric 132 and conductive wiring 134 located therein.

Next, a blanket SOI wafer 90 having a first SOI layer 96 that has a different crystallographic orientation than that of the second SOI layer 128 is stacked atop the structure shown in FIG. 2A such that the bottom Si-containing layer 92 of the blanket SOI wafer 90 becomes the upper most layer of the stacked structure. The stacked structures are then bonded as described above providing the structure shown in FIG. 2B. Reference numeral 94 denotes the buried insulating layer of the blanket SOI wafer 90.

The bottom Si-containing layer 92 and the buried insulating layer 94 of the blanket SOI wafer 90 are then removed utilizing grinding, chemical mechanical polishing and/or etching to expose the first SOI layer 96 of the blanket SOI wafer 90.

Figure 2C:
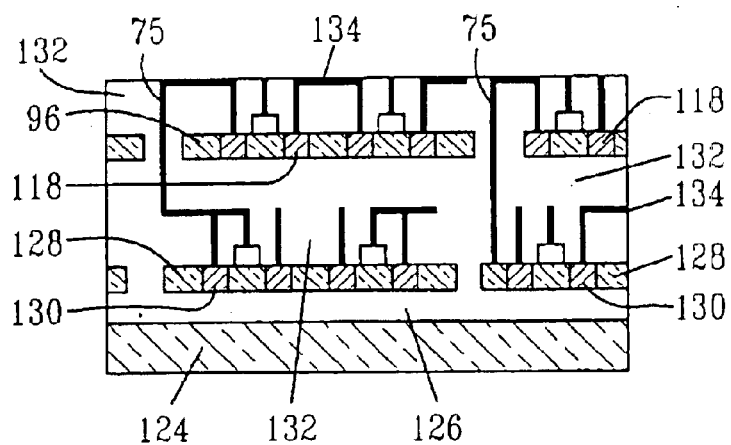

First semiconductor devices 118 such as nFET or pFET are then fabricated on the first SOI layer 96 utilizing the techniques described above. Back-end-of the-line processing can be used to form an interconnect structure 150 atop the now fabricated blanket SOI wafer and the above-mentioned processing can be employed in forming the vertical interconnects 75. The resulting stricture is shown in FIG. 2C.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A three-dimensional (3D) integration scheme comprising:

providing a first interconnect structure comprising at least a first semiconductor device located on a surface of a first Si-containing layer of a first silicon-on-insulator substrate, said first Si-containing layer having a first surface orientation that is optimal for said first semiconductor device;

attaching a handling wafer to a surface of the first interconnect structure;

providing a second interconnect structure comprising at least a second semiconductor device that differs from the first semiconductor device on a surface of a second Si-containing layer of a second silicon-on-insulator substrate, said second Si-containing layer having a second surface orientation that is optimal for said second semiconductor device;

bonding the first and second interconnect structures to each other; and removing the handling wafer.

2. The 3D integration scheme of claim 1 further comprising forming vertical interconnects between the first and second semiconductor devices.

3. The 3D integration scheme of claim 2 wherein said step of forming vertical interconnects comprises lithography, etching and deposition of a conductive metal.

4. The 3D integration scheme of claim 1 wherein said step of attaching comprises applying a polymeric adhesive to a surface of the first interconnect structure, and bringing the handling wafer and first interconnect structure containing said polymeric adhesive into intimate contact with each other.

5. The 3D integration scheme of claim 4 further comprising applying an external force to the contacted handling wafer and first interconnect structure containing said polymeric adhesive.

6. The 3D integration scheme of claim 4 further comprising heating the contacted handling wafer and first interconnect structure containing said polymeric adhesive to a temperature above the melting point of the polymeric adhesive.

7. The 3D integration scheme of claim 1 wherein the first semiconductor device is a pFET, the first semiconductor layer has a (110) crystallographic orientation, the second semiconductor device is an nFET, and the second semiconductor layer has a (100) crystallographic orientation.

8. The 3D integration scheme of claim 1 wherein the first semiconductor device is an nFET, the first semiconductor layer has a (100) crystallographic orientation, the second semiconductor device is a pFET, and the second semiconductor layer has a (110) crystallographic orientation.

9. The 3D integration scheme of claim 1 wherein the step of heating is performed at a temperature from about 200° to about 1050° C. for a period of time from about 2 to about 20 hours.

10. The 3D integration scheme of claim 1 wherein the step of heating is performed in an inert ambient.

11. A 3D integration scheme of the present invention comprising:

bonding a blanket silicon-on-insulator (SOI) substrate having a first SOI layer of a first crystallographic orientation to a surface of a pre-fabricating wafer having at least one second semiconductor device on a second SOI layer that has a different crystallographic orientation than the first SOI layer; and forming at least one first semiconductor device is said first SOI layer.

12. The 3D integration scheme of claim 11 further comprising forming vertical interconnects between the first and second semiconductor devices.

13. The 3D integration scheme of claim 12 wherein said step of forming vertical interconnects comprises lithography, etching and deposition of a conductive metal.

14. The 3D integration scheme of claim 11 wherein the first semiconductor device is a pFET, the first SOI layer has a (110) crystallographic orientation, the second semiconductor device is an nFET, and the second SOI has a (100) crystallographic orientation.

15. The 3D integration scheme of claim 11 wherein the first semiconductor device is an nFET, the first SOI has a (100) crystallographic orientation, the second semiconductor device is a pFET, and the second SOI layer has a (110) crystallographic orientation.

16. The 3D integration scheme of claim 11 wherein the step of bonding is performed at a temperature from about 200° to about 1050° C. for a period of time from about 2 to about 20 hours.

17. The 3D integration scheme of claim 16 wherein the step of bonding is performed in an inert ambient.

18. The 3D integration scheme of claim 11 wherein the first semiconductor device is formed by a CMOS process.

19. The 3D integration scheme of claim 11 further comprising a step of removing a bottom Si-containing layer and a buried insulating layer of said blanket SOI substrate after bonding, but prior to said forming step.

* * * * *